US009755727B2

(12) United States Patent
Lueck

(10) Patent No.: US 9,755,727 B2
(45) Date of Patent: Sep. 5, 2017

(54) REDUNDANCY SCHEME FOR ANALOG CIRCUITS AND FUNCTIONS FOR TRANSIENT SUPPRESSION

(71) Applicant: Tesat-Spacecom GmbH & Co. KG, Backnang (DE)

(72) Inventor: Volker Lueck, Auenwald (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 0 days.

(21) Appl. No.: 14/699,139

(22) Filed: Apr. 29, 2015

(65) Prior Publication Data

US 2015/0318915 A1    Nov. 5, 2015

(30) Foreign Application Priority Data

Apr. 30, 2014    (DE) ......................... 10 2014 006 229

(51) Int. Cl.
*H04B 7/185* (2006.01)
*H04B 15/00* (2006.01)
*H03K 19/003* (2006.01)

(52) U.S. Cl.
CPC ..... *H04B 7/18513* (2013.01); *H03K 19/0033* (2013.01); *H03K 19/00392* (2013.01); *H04B 15/00* (2013.01)

(58) Field of Classification Search
CPC ...... G06F 11/14; G06F 11/16; G06F 11/1687; H04B 7/18513; H04B 7/18515; H04B 15/00; H03K 19/003; H03K 19/0033; H03K 19/00392
USPC ............. 455/63.1, 12.1, 67.13, 427; 370/316
See application file for complete search history.

(56) References Cited

U.S. PATENT DOCUMENTS

| 3,305,735 A | 2/1967 | Moreines |
| 7,579,879 B2 * | 8/2009 | Erstad ............... H03K 5/1252 327/407 |
| 7,792,230 B1 * | 9/2010 | Gallagher ........... G06F 11/1687 375/354 |
| 2002/0101269 A1 | 8/2002 | Swonger |
| 2007/0109012 A1 | 5/2007 | Erstad et al. |
| 2007/0205799 A1 | 9/2007 | Von Thun |

FOREIGN PATENT DOCUMENTS

DE    1 431 149 A1    12/1969

OTHER PUBLICATIONS

European Search Report issued in counterpart European Application No. EP 15 00 0985 dated Aug. 25, 2015, with Statement of Relevancy (Two (2) pages).

* cited by examiner

*Primary Examiner* — Raymond Dean
(74) *Attorney, Agent, or Firm* — Crowell & Moring LLP

(57) ABSTRACT

An interference-suppression circuit produces an interference-reduced signal from output signals of a plurality of redundant functional blocks. A first extreme-value determination unit determines the specific output signal that represents a first extreme value from the output signals of the functional blocks. A processing unit offsets the output signals of the plurality of functional blocks against one another in such a manner that the interference-reduced signal is determined. The processing unit omits from consideration the first extreme value in determining the interference-reduced signal.

8 Claims, 1 Drawing Sheet

REDUNDANCY SCHEME FOR ANALOG CIRCUITS AND FUNCTIONS FOR TRANSIENT SUPPRESSION

CROSS-REFERENCE TO RELATED APPLICATIONS

This application claims priority under 35 U.S.C. §119 to German application 10 2014 006 229.5, filed Apr. 30, 2014, the entire disclosure of which is herein expressly incorporated by reference.

FIELD OF THE INVENTION

Exemplary embodiments of the invention relate to an interference-suppression circuit for making available an interference-reduced signal, based on a plurality of redundant functional blocks, as well as to a spacecraft having such an interference-suppression circuit, particularly to a satellite having such an interference-suppression circuit.

BACKGROUND OF THE INVENTION

Particularly when using electrical circuits in radiation-burdened environments, for example in space at the edge of the earth's atmosphere, or outside of the atmosphere in a vacuum, interference effects caused by radiation can occur in electronic components, so that as the result of such interference in the individual electronic components, the method of operation of an electrical circuits as a whole is disrupted.

A typical mechanism for eliminating such interference in digital circuits is redundancy on the basis of a majority decision. In this connection, multiple functional blocks of the same type are used to perform a function, and the respective output signals of these functional blocks are passed to a majority decision, i.e., the specific output signal that was output by most of the functional blocks is selected from the output signals of the functional blocks, which deviate from one another, if applicable, for further processing.

In the case of analog circuits, such a mechanism is not possible, because value-continuous signals are being processed. A majority decision is therefore practically impossible, because due to the value-continuous signals, even the slightest deviations between two output signals do not permit a majority decision.

Known approaches for reducing radiation-related interference effects in analog circuits involve forming an average value from the output signals of multiple redundant functional blocks or that of selecting an average value from the sorted amount of all of the output signals.

US 2007/0109012 A1 describes a circuit structure for reducing interference effects in redundant functional blocks, using comparators and sorting.

SUMMARY OF THE INVENTION

Exemplary embodiments of the present invention are directed to an interference-suppression circuit that increases a precision of an interference-reduced signal determined by this circuit, in a radiation-burdened environment.

In average-value formation, the influence of interference is merely reduced, but under no circumstances is it eliminated. The more redundant functional blocks are used, the less the influence of the output signal of an interference-disrupted functional block on the signal averaged over all of the output signals.

If, in contrast, a switch is made between multiple output signals of redundant functional blocks, for example in order to make the average signal of all of the output signals of the functional blocks available at every point in time, a comparator is required for this purpose, which compares two or more output signals with one another, in each instance. However, such a comparator can also be susceptible to interference under the influence of radiation, so that the reliability of the determined signal can be low in this connection, as well.

In addition, when two of the same signals are applied to the comparator, disruptive, unwanted, and unnecessary switching procedures can arise.

In connection with this application, radiation is understood to be energy radiation that can influence an electrical component in terms of its method of working and functioning. Energy radiation is, for example, high-energy cosmic particle radiation consisting of protons, electrons and/or ionized atoms, gamma radiation or X-ray radiation.

A first aspect of the invention relates to an interference-suppression circuit for making available an interference-reduced signal. The interference-suppression circuit has a plurality of redundant functional blocks, which are structured for making an output signal available, in each instance. Furthermore, the interference-suppression circuit has a first extreme-value determination unit, which is structured for determining the specific output signal that represents an extreme value from the output signals of the functional blocks. Furthermore, the interference-suppression circuit has a processing unit structured for offsetting the output signals of the plurality of functional blocks against one another in such a manner that the interference-reduced signal is determined. In this connection, the processing unit is structured in such a manner that it leaves the first extreme value out of consideration in the determination of the interference-reduced signal.

The interference-suppression circuit particularly minimizes or eliminates the influence of an output signal of a disrupted functional block on the interference-reduced signal.

The functional blocks are structured for performing the same operation redundantly. This can involve safety-relevant calculations, or, for example, navigation data of an aircraft or spacecraft, or other calculations in their on-board systems, or in instruments on board of aircraft or spacecraft. The functional blocks can be analog functional blocks, i.e., the output signal represents a value-continuous and/or time-continuous signal. In particular, the functional blocks can be radiation-sensitive functional blocks.

The interference-reduced signal is determined without the output signal that represents the extreme value. With the assumption that radiation-related interference of an electronic component or of a functional block leads to a defective output signal, which deviates from the correctly determined output signals of the functional blocks, the interference-suppression circuit can eliminate the influence of this disrupted output signal on the determination of the interference-reduced signal, to the extent that the disrupted output signal is specifically the output signal that represents the extreme value in the amount of the output signals.

The interference-reduced signal is determined without using interference-susceptible comparators or switching procedures.

The processing unit determines a single interference-reduced signal from the total number of output signals of the functional blocks, as well as considers the extreme values determined by means of the extreme-value determination units. This can be achieved, for example, by means of sum formation, wherein the individual output signals are directly used for sum formation, and the extreme values are subtracted from the sum, over all of the output signals. Alternatively, the output signals can be multiplied by a factor or by one another, before the interference-reduced signal is determined accordingly.

According to one embodiment, the first extreme-value determination unit is structured for determining a maximal value of the output signals of the functional blocks, so that the first extreme value corresponds to the maximal value of the output signals of the functional blocks.

According to a further embodiment, the interference-suppression circuit has a second extreme-value determination unit, which is structured for determining a second extreme value of the output signals of the functional blocks. The second extreme value corresponds to a minimal value of the output signals of the functional blocks.

As a result, the case that interference of a functional block has a positive or negative effect on the output signal can be taken into consideration. Because the actual effect of interference in a preliminary stage is unknown in many cases, a deviation of an output signals upward or downward can therefore be absorbed by the output signals of the other functional blocks in determining the interference-reduced signal, i.e., interference remains out of consideration for the determination of the interference-reduced signal, independent of its direction of effect on the deviation of an output signal.

In other words, a maximal value (positive extreme value) and a minimal value (negative extreme value) are therefore not taken into consideration in determining the interference-reduced signal.

In a further embodiment, more than one positive extreme value (for example the two highest values) and more than one negative extreme value (for example the two lowest values) can also remain out of consideration in determining the interference-reduced signal, for example if calculations are performed with more than one or two disrupted functional blocks. However, it holds true that the effort for determining additional maximal or minimal values increases, and the interference-suppression circuit can thereby increase in complexity, and that thereby the time period for determining the interference-reduced signal can increase.

According to a further embodiment, the processing unit is structured for leaving at least one extreme value out of consideration in determining the interference-reduced signal.

This can be the maximal value or the minimal value. If, for example, the direction of effect of an interference is known, the processing unit can be restricted to not take into consideration the maximal value or the minimal value, which can simplify the method of operation of the interference-suppression circuit or can reduce the calculation time of the processing unit, for example.

According to a further embodiment, the processing unit is structured to not take into consideration the first extreme value and the second extreme value in determining the interference-reduced signal.

This requires no case differentiation regarding the direct of effect of the interference effects, and thereby can improve the use of the interference-suppression circuit in environments having alternating interference influences.

According to a further embodiment, the processing unit is structured as a summation mechanism. The summation mechanism is configured for determining the interference-reduced signal as the sum of the output signals of the functional blocks, and, in the determination of this sum, to leave one of the two extreme values out of consideration.

According to a further embodiment, the summation mechanism is structured for determining the interference-reduced signal as the sum of the output signals of the functional blocks, and, in the determination of this sum, to leave the first extreme value and the second extreme value out of consideration.

According to a further embodiment, the summation mechanism is structured for determining the interference-reduced signal as the sum of all of the output signals, and for subtracting an extreme value from this, before the interference-reduced signal is made available. In other words, the output signal, which represents an extreme value before the extreme value is subsequently deducted from the sum again, is therefore also used for sum formation.

In this embodiment, the summation mechanism can have a simple structure, because independent of which functional block delivers the extreme value, at first all of the output signals are passed to an adder. Passing the extreme values to subtraction from the sum then takes place depending on which output signal does, in fact, represent the extreme value.

Alternatively, the summation mechanism can be structured in such a manner that the extreme value is not passed to sum formation in the first place, in other words is already left out of consideration during sum formation.

In the end result, these two variants do not have any effect on the value of the interference-reduced signal, but rather merely on the method and manner of determining the interference-reduced signal.

According to a further embodiment, the interference-suppression circuit has three or more functional blocks.

This number of functional blocks allows not taking into consideration the minimal and the maximal value, wherein then, a single output signal of a functional block, namely the output signal having the average value, remains for determining the interference-reduced signal.

Every further functional block by which the number of functional blocks exceeds the number three contributes to the redundancy for determining the interference-reduced signal, in the event that the output signals of two functional blocks (minimal value and maximal value) are not taken into consideration.

According to a further embodiment, the interference-suppression circuit has an average-value formation unit that is structured for forming an averaged signal from the interference-reduced signal.

According to a further embodiment, the average-value formation unit is structured for forming the averaged signal by means of division of the interference-reduced signal by the number of functional blocks minus the extreme values not taken into consideration in determining the interference-reduced signal.

The mean-value formation unit can be coupled with the processing unit in such a manner that the number of extreme values that are left out of consideration in determining the interference-reduced signal are transmitted to the average-value formation unit, so that the average value takes place on the basis of the correct number of output signals taken into consideration.

In the case of eight functional blocks and non-consideration of minimal value and maximal value of the output signals of the functional blocks, six output signals are taken into consideration for determining the interference-reduced signal. In the case of sum formation, this can either be formed over all eight output signals, with subsequent subtraction of minimal value and maximal value from this sum, or the two extreme values are not taken into consideration at all for the sum formation. For the average-value formation, the interference-reduced signal is divided by six, because the interference-reduced signal was also determined only on the basis of six output signals.

In general, this relationship can be expressed as follows:

averaged signal=(sum of all output signals−maximal value−minimal value)/(number of functional blocks−2)

The interference-suppression circuit as described above and in the following can be used in any circuit that is sensitive to radiation and generates radiation-dependent transients. The interference-suppression circuit can be integrated into semiconductor circuits.

According to a further aspect, a spacecraft having an interference-suppression circuit as described above and in the following is indicated.

According to one embodiment, the spacecraft is a satellite.

Furthermore, it should be noted that the inventive concept can also be used in high mountain ranges (elevated cosmic radiation) or in the area of nuclear research facilities.

BRIEF DESCRIPTION OF THE DRAWINGS

In the following, exemplary embodiments of the invention will be discussed in greater detail using the attached drawings. These show.

DETAILED DESCRIPTION

Figure 1:
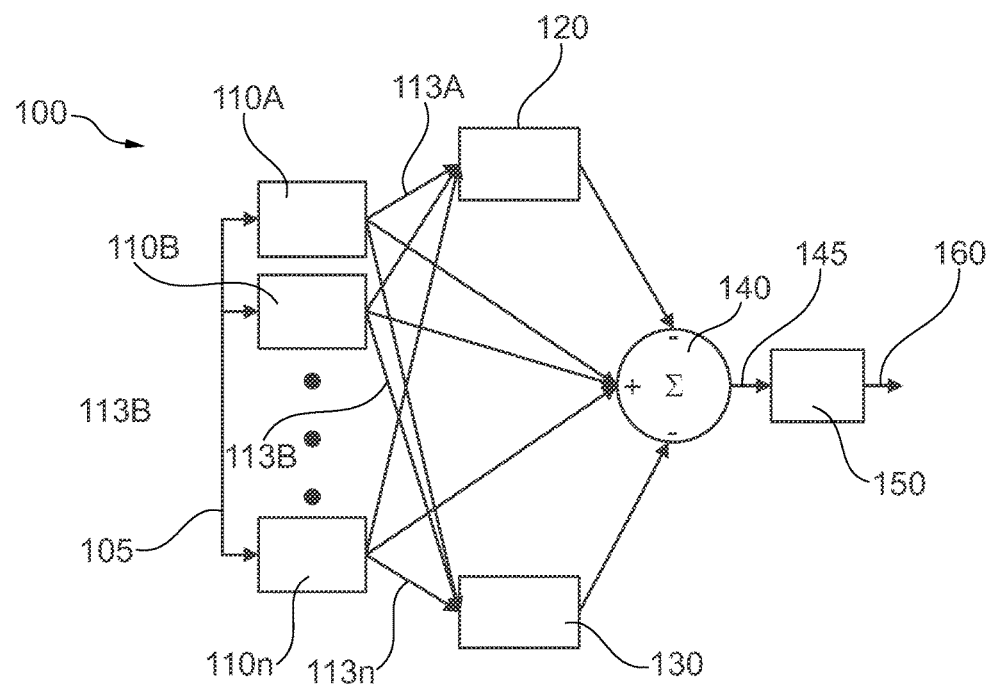
FIG. 1 a schematic representation of an interference-suppression circuit in accordance with an exemplary embodiment.

FIG. 1 shows an interference-suppression circuit 100 having a plurality of redundant functional blocks 110A, 110B, 110n. The functional blocks are supplied with an input signal 105, in each instance. The input signals of the functional blocks can be data or values that are identical; the operations performed by the functional blocks can also be identical.

Each functional block determines its own output signal 113A, 113B, 113n, based on the input signal 105. All of the output signals 113A, 113B, 113n are transmitted not only to the first extreme-value determination unit 120, to the second extreme-value determination unit 130, but also to the processing unit 140.

The first extreme-value determination unit 120 determines the maximal value of the output signals, and the second extreme-value determination unit 130 determines the minimal value of the output signals.

The processing unit 140 is structured as a summation mechanism or adder, and determines the sum over all of the output signals 113A, 113B, 113n.

Before the processing unit 140 outputs the interference-reduced signal 145, the maximal value and the minimal value are subtracted from the sum over all of the output signals.

The interference-reduced signal 145 is passed to an average-value formation unit 150, which forms the averaged signal 160 from this.

Figure 2:
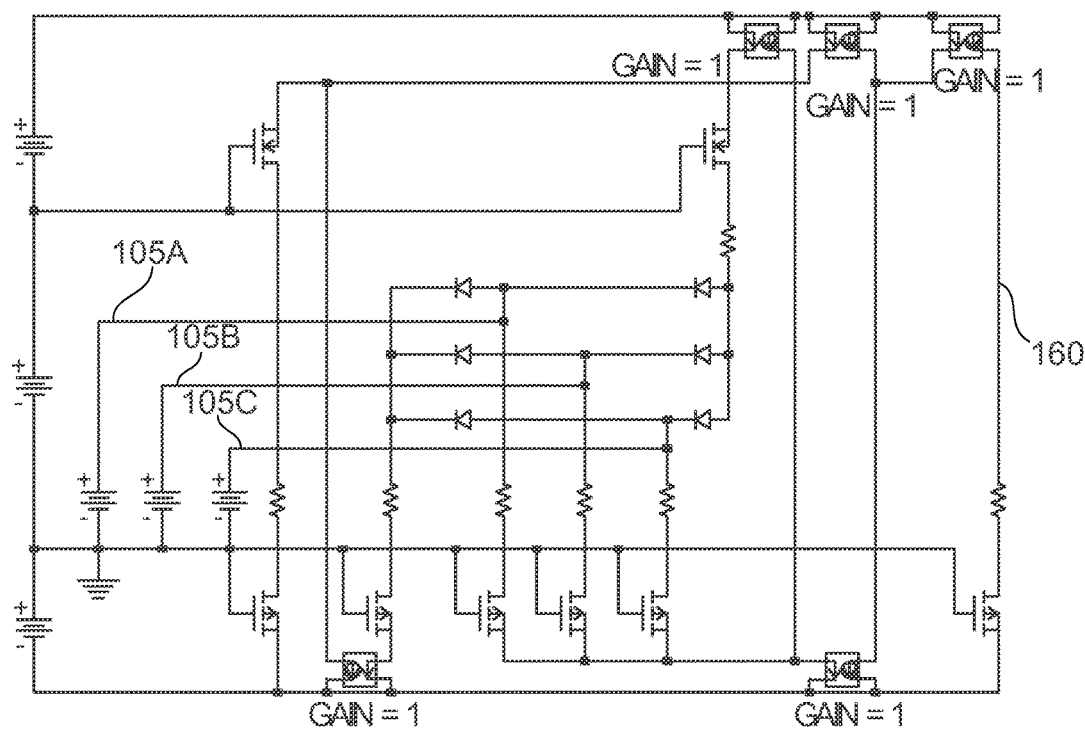
FIG. 2 a schematic representation of an interference-suppression circuit in accordance with a further exemplary embodiment.

FIG. 2 shows an exemplary implementation of the functions of the summation and of the extreme-value determination.

In this example, the addition of currents is shown for sum formation, and linking by way of diodes is shown for the extreme-value determination. The average-value formation can take place by means of selecting a resistance ratio.

This implementation is characterized in that the extreme-value determination takes place very quickly, and the circuit constructs and electronic components used in total can themselves be viewed as being non-sensitive to radiation. The current levels used can also be viewed as being sufficiently fast so that essentially simultaneous arrival of all the summands, i.e., output signals of the functional blocks, at the summation point, i.e. at the processing unit, can be assumed, which contributes to eliminating interference.

In FIG. 2, the functional blocks are shown as three voltage sources, as an example, so that the voltage value corresponds not only to the input signal 105A, 105B, 105C but also to the output signal of the functional blocks, because no processing of the input signal in the functional blocks takes place.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An interference-suppression circuit for producing an interference-reduced signal, the interference-suppression circuit comprising:
   a plurality of redundant functional blocks, each of which receive a same input signal and produce a continuous value output signal;
   a first extreme-value determination unit, which is configured to determine a specific output signal representing a first extreme value from the output signals of the plurality of functional blocks;
   a second extreme-value determination unit, which is configured to determine a second extreme value of the output signals of the plurality of functional blocks; and
   a processing unit configured to offset the output signals of a majority of functional blocks against one another in order to determine the interference-reduced signal,
   wherein the processing unit is configured to omit the first extreme value and the second extreme value from consideration when determining the interference-reduced signal,
   wherein the processing unit is a summer that is configured to determine the interference-reduced signal as a sum of the output signals of the plurality of functional blocks while omitting the first extreme value and the second extreme value from consideration in determining the sum,
   wherein the summer is configured to determine the interference-reduced signal as a sum of all of the output signals, and configured to subtract an extreme value from the sum before the interference-reduced signal is produced, wherein the first extreme-value determination unit is configured to determine a maximal value of the output signals of the plurality of functional blocks, so that the first extreme value corresponds to the maximal value of the output signals of the plurality of functional blocks, wherein the second extreme value corresponds to a minimal value of the output signals of the plurality of functional blocks, wherein the maximal value is an output signal which is greater than the other output signals of the functional blocks, and wherein the minimal value is an output signal which is smaller than the other output signals of the functional blocks.

2. The interference-suppression circuit of claim 1, wherein the processing unit is configured to omit at least one extreme value from consideration when determining the interference-reduced signal.

3. The interference-suppression circuit of claim 1, further comprising:
an average-value formation unit configured to form an averaged signal from the interference-reduced signal.

4. The interference-suppression circuit of claim 3, wherein the average-value formation unit is configured to form the averaged signal by dividing the interference-reduced signal by a number of the plurality of functional blocks minus the extreme values omitted from consideration in determining the interference-reduced signal.

5. A spacecraft, comprising:
an interference-suppression circuit for producing an interference-reduced signal, the interference-suppression circuit comprising:
  a plurality of redundant functional blocks, each of which receive a same input signal and produce a continuous value output signal;
  a first extreme-value determination unit, which is configured to determine a specific output signal representing a first extreme value from the output signals of the plurality of functional blocks;
  a second extreme-value determination unit, which is configured to determine a second extreme value of the output signals of the plurality of functional blocks; and
  a processing unit configured to offset the output signals of a majority of functional blocks against one another in order to determine the interference-reduced signal,
  wherein the processing unit is configured to omit the first extreme value and the second extreme value from consideration when determining the interference-reduced signal,
  wherein the processing unit is a summer that is configured to determine the interference-reduced signal as a sum of the output signals of the plurality of functional blocks while omitting the first extreme value and the second extreme value from consideration in determining the sum,
  wherein the summer is configured to determine the interference-reduced signal as a sum of all of the output signals, and configured to subtract an extreme value from the sum before the interference-reduced signal is produced,
  wherein the first extreme-value determination unit is configured to determine a maximal value of the output signals of the plurality of functional blocks, so that the first extreme value corresponds to the maximal value of the output signals of the plurality of functional blocks,
  wherein the second extreme value corresponds to a minimal value of the output signals of the plurality of functional blocks,
  wherein the maximal value is an output signal which is greater than the other output signals of the functional blocks, and
  wherein the minimal value is an output signal which is smaller than the other output signals of the functional blocks.

6. The spacecraft of claim 5, wherein the spacecraft is a satellite.

7. A method for producing an interference-reduced signal, the method comprising:
producing, by a plurality of redundant functional blocks, a continuous value output signal based on receipt of a same input signal;
determining, by a first extreme-value determination unit, a specific output signal representing a first extreme value from the output signals of the plurality of functional blocks;
determining, by a second extreme-value determination unit, a second extreme value of the output signals of the plurality of functional blocks;
offsetting, by a processing unit the output signals of a majority of functional blocks against one another in order to determine the interference-reduced signal;
wherein the processing unit omits the first extreme value and the second extreme value from consideration when determining the interference-reduced signal,
wherein the processing unit is a summer that determines the interference-reduced signal as a sum of the output signals of the plurality of functional blocks while omitting the first extreme value and the second extreme value from consideration in determining the sum,
wherein the summer determines the interference-reduced signal as a sum of all of the output signals, and configured to subtract an extreme value from the sum before the interference-reduced signal is produced,
wherein the first extreme-value determination unit determines a maximal value of the output signals of the plurality of functional blocks, so that the first extreme value corresponds to the maximal value of the output signals of the plurality of functional blocks,
wherein the second extreme value corresponds to a minimal value of the output signals of the plurality of functional blocks,
wherein the maximal value is an output signal which is greater than the other output signals of the functional blocks, and
wherein the minimal value is an output signal which is smaller than the other output signals of the functional blocks.

8. The method of claim 7, further comprising:
forming, by an average-value formation unit, an averaged signal from the interference-reduced signal.

* * * * *